United States Patent [19]

Carpenter et al.

[11] Patent Number: 4,851,769
[45] Date of Patent: Jul. 25, 1989

[54] NON-DESTRUCTIVE TESTER FOR TRANSISTORS

[75] Inventors: Grant Carpenter, Christiansburg; Fred C. Lee; Dan Y. Chen, both of Blacksburg, all of Va.

[73] Assignee: Virginia Tech Intellectual Properties, Inc., Blacksburg, Va.

[21] Appl. No.: 179,812

[22] Filed: Apr. 11, 1988

[51] Int. Cl.$^4$ .......................... G01R 31/26; G01R 1/36
[52] U.S. Cl. ............................ 324/158 T; 324/158 D; 324/110
[58] Field of Search .......... 324/158 T, 158 D, 158 R, 324/110; 307/530, 363, 564; 328/9; 361/56, 91

[56] References Cited

U.S. PATENT DOCUMENTS 3,371,276  2/1968  Schiff ............................. 324/158 T
3,895,297  7/1975  Jarl ................................. 324/158 T

*Primary Examiner*—Ernest F. Karlsen
*Attorney, Agent, or Firm*—Mason, Fenwick & Lawrence

[57] ABSTRACT

A non-destructive reverse-bias second breakdown tester for testing semiconductor devices such as transistors and thyristors that have a base-collector-emitter configuration. The tester basically comprises a socket for holding the device under test. A base drive provides a drive current to the base of the device under test. A collector supply provides a collector current to the device under test. A current diverter diverts current away from the device under test when the device under test experiences reverse-bias second breakdown. The diverter includes first, second and third switches arranged in series. A diode diverter is connected to the current supply and the third switch. A detector produces a first signal at the onset of reverse-bias second breakdown in the device under test. In response to the first signal, the first, second and third switches are activated in seriatim. The activation of all of the first, second and third switches causes the current applied to said device under test to be diverted through said diode diverter and the first, second and third switches.

14 Claims, 6 Drawing Sheets

NON-DESTRUCTIVE TESTER FOR TRANSISTORS

BACKGROUND OF THE INVENTION

The present invention relates to transistor testers, in general, and to a non-destructive reverse-bias second breakdown tester for transistors, thyristors and the like, in particular.

FIELD OF THE INVENTION

The production and use of high power transistors requires several tests in order to maintain product reliability and quality control. One of the critical tests for bipolar transistors and gate turn-off (GTO) thyristors is reverse-bias second breakdown (RBSB). An objective when testing for second breakdown is to take a device under test into breakdown and save it from destruction so that repeated measurements can be made.

Non-destructive testing is essential for principally two reasons. One is that high power transistors are too expensive to perform destructive testing for RBSB characterization on a statistical basis. More importantly, a non-destructive tester permits investigation of a transistor's RBSB characteristics under various driving conditions using the same transistor. This is especially important, since manufacturing tolerances create situations where the operating characteristics of a particular type of transistor differ from device to device.

The National Bureau of Standards has successfully constructed a reverse-bias second breakdown transistor tester. See, in particular, NBS Special Publication 400-54, March 1979, entitled "Semi-conductor Measurement Technology: A Reverse-bias Safe Operating Area Transistor Tester", written by D. W. Berning. The current capability of the prior art tester built by the National Bureau of Standards was limited to only 30 A. This limitation excludes the use of the tester as a high current power tester for high current power transistors which are currently available through many of the major power device manufacturers in the world such as Westinghouse, General Electric, Motorola, West Code, Fuji, Toshiba, Mitsubishi, Power Transistors, Power Tech and Thompson's CFF, to name a few.

In 1985, under a NASA/Department of Energy contract (NAG 3-99), another prior art non-destructive transistor and GTO reverse base second breakdown tester was devised by the present inventors. See, in particular, the final report entitled "A 100 V, 120 A Nondestructive Reverse Bias Second Breakdown Tester For Bipolar Power Transistors", prepared by Virginia Polytechnic Institute and State University, by F. C. Lee, D. Y. Chen and G. Carpenter on Feb. 11, 1985, and incorporated by reference herein. The tester was capable of handling up to 1,000 V and 120 A, simultaneously. The tester consisted of three basic components: (1) a collector supply; (2) a base drive; and (3) a shunt circuit. The collector supply was a stand-alone, variable 300 V, 100 A conventional unit. One such unit is made by Tektronix under Model No. P5503A. The base drive included the capability of providing a higher base drive output current then found in the National Bureau of Standard's design and the option of two reverse-bias drives for Darlington transistors. The basic shunt circuit increased the speed and power handling capability not found in the National Bureau of Standard's design. This modification provided the test system with the capacity required to reliably test high power devices at current levels up to 120 A and 1,000 V.

In the prior art tester developed under the NASA/DOE contract, a transistor to be tested is connected in a common emitter configuration with an inductor possessing an inductive current in the collector circuit. When the transistor under test is switched on with a forward bias pulse, the collector current in the transistor rises. When the transistor under test is driven with a turn-off pulse, the collector voltage reaches a high value before there is much reduction in the collector current.

A variable voltage clamp acts to prevent the collector voltage from going above a pre-set voltage level. Once the collector voltage reaches the value of a clamp voltage, the inductive current is diverted from the transistor under test to the clamp supply. The clamp voltage is normally set below device breakdown DC collector-base voltage with the emitter open ($BV_{CBO}$) to prevent the device from being destroyed. The second breakdown is characterized by a rapid fall in voltage before the collector current reaches zero. Typically, the collector voltage of a transistor may fall about 500 V in 10 to 20 ns. This rapid fall is detected in the tester with a capacitive pick-up that triggers the high speed shunt circuit. This circuit removes the remainder of the energy stored in the inductor and shunts the clamp voltage to a negative power supply. The clamp supply for the transistor under test has an additional diode-resistor-inductor network that allows the clamp voltage to go negative for a short period of time and then decay to zero. This is done to overcome the inductance in the wire that connects the protection circuit to the transistor under test. Several power Schottky diodes are put in series with the collector of the transistor under test to effectively open the collector lead when the clamp voltage is driven negative. When the protection circuit fires, the clamp supply and its voltage supply are turned off. The protection circuit should remove the current from the transistor under test as quickly as possible.

This prior art tester developed under the NASA/DOE contract included an array of 64 vacuum tubes connected in parallel in order to provide 120 A. Vacuum tubes were used because at that time they were the only devices capable of blocking 1200 V and turning on fast enough to do so. However, it was appreciated at that time that a further increase in the number of tubes in parallel would not increase the tester's capability because parasitic inductance associated with the physical size of the tubes limited the time that current could flow from a device under test.

The NASA/DOE non-destructive tester was operated in one mode, a one-shot measurement mode. In the one-shot measurement mode, a manual trigger button was used. The test was executed approximately twenty seconds after the manual trigger button was pressed.

The voltage capability of the prior art NASA/DOE non-destructive tester was limited by the vacuum tube clamp voltage rating of the shunt circuit. 1000 V was the limitation of the tester. The current capacity of the tester depended critically on how fast the collector current of the device under test could be diverted from the device once reverse-bias second breakdown occurred.

In light of current transistor and GTO thyristor designs, there is a need for a new non-destructive reverse-bias second breakdown tester that is capable of operating with a rating of 1800 V and 300 A. A present invention is directed toward filling that need.

SUMMARY OF THE INVENTION

A preferred embodiment of an non-destructive tester incorporating the teachings of the subject invention basically comprises a collector supply, a base drive for driving the base of a device under test and a current diverter.

The collector supply basically comprises a grounded voltage supply that is adjustable in the 0 to 40 VDC range. The output of the voltage supply is connected to a grounded capacitor and to the parallel arrangement of a resistor and an inductor. The other end of the parallel resistor/inductor arrangement is fed through an assembly of serially connected diodes which are connected to the collector of the device under test (DUT).

The base drive for the DUT provides three independently adjustable current sources; one for the forward base current, another for the reverse base current and a third for the reverse base current of the second base terminal found in some Darlington transistors. The forward base current is adjustable from 1A to 16A and the reverse base current from 2A to 32A. For both reverse drive circuits, a voltage clamp of adjustable magnitude from 0 to −15 VDC is provided. The clamp is used to limit the reverse voltage across the base-emitter junction of the transistor under test.

The current diverter basically comprises a MOSFET shunt circuit that is connected to the collector of the device under test through a capacitor. In turn, the shunt circuit is connected to the collector circuit through an assembly of series connected diodes.

The shunt circuit is also connected to the emitter of the device under test through the parallel arrangement of a diode and a capacitor. The shunt is also connected to a voltage supply through a resistor. The voltage supply provides a −200 VDC output.

In the collector circuit, a series arrangement of a resistor and a capacitor are connected in parallel with the cathode of the first diode and the anode of the last diode in the series diode arrangement that is connected to the collector of the DUT.

Three metal oxide semiconductor field effect transistor (MOSFET) assemblies are connected in series. The gates of the first two MOSFET assemblies are respectively connected to first and second gate drives.

A latch is operably connected to the gate of the third MOSFET assembly. In like manner, the latch is connected to the source of the third transistor assembly to the −200 VDC supply.

Non-destructive second breakdown tests are performed with the base of the DUT connected to the base drive, the collector of the DUT connected to the diode assembly that forms part of the collector circuit and the emitter connected to ground. Forward and reverse base drive conditions were pre-set prior to each test. All tests are single-shot and manually triggered.

During a test, a constant-current forward drive is applied from the base drive to the DUT enabling the collector current to ramp up through the inductor in the collector supply. A constant-current reverse drive is applied following completion of the forward drive to turn off the DUT. Due to inductance, the collector voltage rises to a pre-set clamping supply value or the primary breakdown voltage of the DUT, whichever is lower. Should the DUT enter second breakdown, the collector voltage falls very rapidly, triggering the shunt circuit. The clamp supply is turned off and the shunt latches on to crowbar current around the DUT. This sequence of events must occur fast enough, typically less than 50 ns, to save the DUT from destruction.

The operation of the shunt circuit may be described as follows: When second breakdown occurs, a sudden drop of $V_{CE}$ for the DUT turns on a transistor which, in turn, causes the three transistor assemblies to be turned on in series with the current of the DUT being diverted through a diode arrangement associated with the three assemblies and the −200 V power supply.

It is thus a primary object of the present invention to provide a tester for non-destructively evaluating the reverse-bias second breakdown of certain devices under test such as transistors and gate turn-off thyristors.

It is another object of the present invention to provide a non-destructive reverse-bias second breakdown tester having a rated performance of 1800 V and 300 A.

It is yet another object of the present invention to provide a tester that is able to take a transistor under test into breakdown and save it from destruction so that repeated measurements can be made.

It is still another object of the present invention to provide a tester that makes it economically feasible to characterize the breakdown capability of high power transistors and gate turn-off thyristors.

These and other objects and advantages will become apparent when the present invention is considered in light of the following detailed description of with reference to the following drawings.

DETAILED DESCRIPTION OF THE PREFERRED EMBODIMENTS

Figure 1:
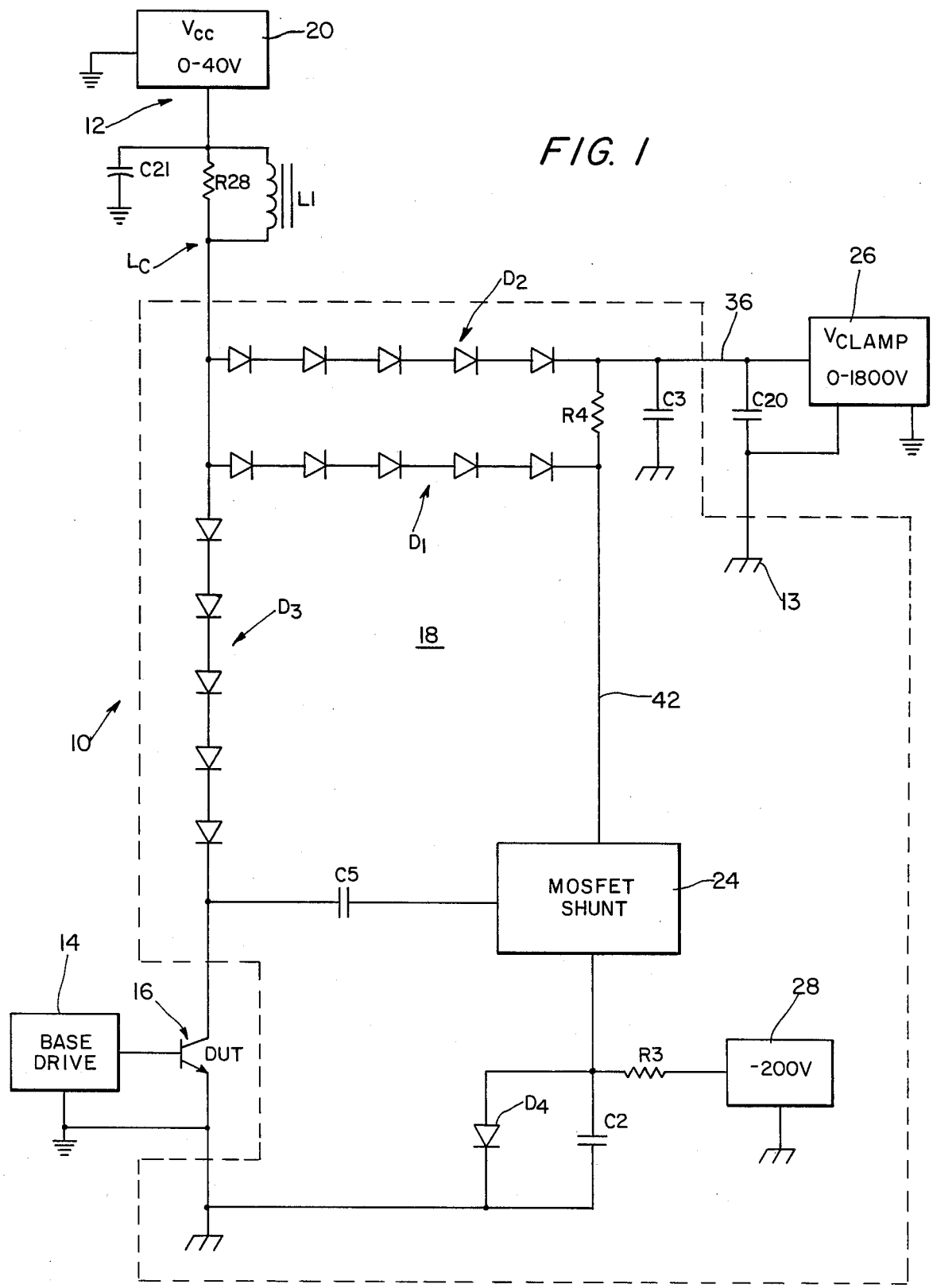
FIG. 1 is a schematic block diagram showing the basic elements of a non-destructive tester incorporating the teachings of the present invention.

In describing the preferred embodiments of the subject invention illustrated in the drawings, specific terminology will be resorted to for the sake of clarity. However, the invention is not intended to be limited to the specific terms so selected, and it is to be understood that each specific term includes all technical equivalents which operate in a similar manner to accomplish a similar purpose.

A preferred embodiment of an non-destructive tester incorporating the teachings of the subject invention is generally shown in FIG. 1. The tester generally designated as 10 basically comprises a collector circuit 12 including a collector 20, a base drive 14 for driving the base of a device under test 16 and a current diverter 18.

The collector supply basically comprises a grounded voltage supply 20 that is adjustable in the 0 to 40 VDC range. The output of the voltage supply is connected to one end of the free end of a grounded capacitor $C_{21}$ and to the parallel arrangement of a resistor $R_{28}$ and an inductor $L_1$. The other end of the parallel resistor/inductor arrangement is fed through a series of serially connected diodes $D_3$. In a preferred embodiment, there are five diodes similarly connected to each other with the cathode of the first diode in the chain being connected to the collector of the device under test. The reason that there are five diodes is to provide five times the inverse voltage of one diode.

The base drive 14 provides three independently adjustable current sources: One to provide a forward base current; another to provide a reverse base current; and a third to provide a reverse base current for the second base terminal found in some Darlington transistors. The forward base current is adjustable from 1A to 16A and the reverse base currents are from 2A to 32A. For both reverse base current, a voltage clamp of adjustable magnitude from 0 to 15 VDC is provided. The clamp is used to limit the reverse voltage across the base-emitter junction of the transistor under test. An embodiment of a base drive suitable for use in practicing the present invention is the previously identified report entitled "A 100 V, 120 A nondestructive Reverse-Bias Second Breakdown Tester for Bipolar Power Transistors", and incorporated by reference herein.

The current diverter 18 basically comprises a MOSFET shunt circuit 24 which will be described in greater detail hereinafter with regard to FIG. 2. Shunt circuit 24 is connected to the collector of the device under test through capacitor $C_5$. In turn, the shunt circuit is connected to the collector circuit through an assembly of series connected diodes $D_1$ and $D_2$ with the anode of the last transistor in each series being connected to the parallel arrangement of resistor 28 and inductor $L_1$. Five diodes are preferably used in each of the diode arrangements for the same reason as diode arrangement $D_3$. The cathode of the first diode of diode arrangement $D_1$ is connected to the shunt circuit through lead 42 and to one end of a resistor $R_4$. The other end of the resistor $R_4$ is connected to the cathode of the first diode in diode arrangement $D_2$ and also to one end of a parallel arrangement of capacitors $C_3$ and $C_{20}$. In turn, the capacitor $C_{20}$ is placed across the output of a voltage clamp power clamp supply 26 that is adjustable between 0 and 1800 VDC. At this point, it should be noted that in the several drawings Earth ground is noted by the striped arrowhead generally designated 11 and also by the sideways slanted E (designated 13). A common connection, on the other hand, is noted by a vacant triangle 15 (FIG. 2).

Shunt circuit 24 is also connected to the emitter of the device under test through the parallel arrangement of diode $D_4$ and capacitor $C_2$. The shunt is also connected to a voltage supply 28 through resistor $R_3$. The voltage supply provides a $-200$ VDC output.

Figure 2:
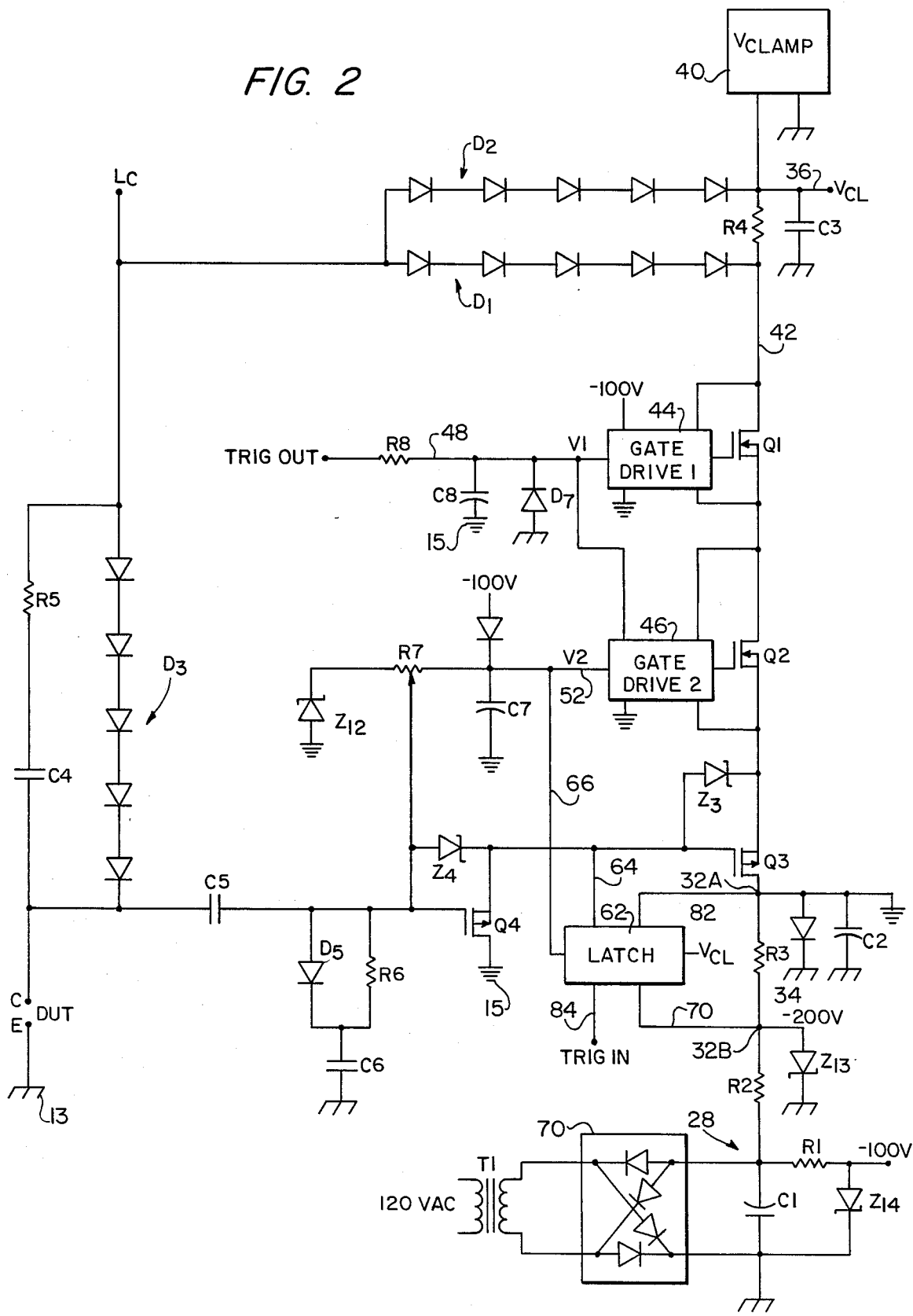
FIG. 2 is a schematic diagram of a preferred embodiment of the shunt circuit shown in FIG. 1.

With reference to FIG. 2, the details of a preferred embodiment of the shunt circuit 24 will now be described.

In the shunt circuit, a series arrangement of resistor $R_5$ and capacitor $C_4$ are connected in parallel with the cathode of the first diode and the anode of the last diode in the series diode arrangement $D_3$. In much the same way, a voltage supply 40 provides a clamping voltage to the cathode of the first diode in the series diode arrangement $D_2$.

Three metal oxide semiconductor field effect transistor (MOSFET) assemblies $Q_1$, $Q_2$ and $Q_3$ are connected in series with the drain of assembly $Q_1$ being connected to the cathode of the first diode in diode arrangement $D_1$ and the drain of transistor assembly $Q_3$ being connected through line $32_A$ to the anode of diode $D_4$. The gates of MOSFETs $Q_1$ and $Q_2$ are respectively connected to first and second gate drives 44 and 46. The details of these gate drives are shown and will be explained later in connection with FIGS. 3 and 4. A floating voltage source $V_1$ is formed by capacitor $C_8$ and diode $D_7$ to supply gate drives 44 and 46. The transition of $V_1$ during shunt turn-on provides a trigger signal out through resistor $R_8$.

The second gate drive receives a signal on line 52 from a $-100$ VDC source that passes through diode $D_6$. Also connected to line 52 is a capacitor $C_7$ and one end of a variable resistor $R_7$. The other end of the variable resistor is connected to a zener diode $Z_{12}$. The wiper of variable resistor $R_7$ is connected through zener diode $Z_4$ to the gate of MOSFET assembly $Q_3$.

The source and gate of MOSFET assembly $Q_3$ are connected to each other through zener diode $Z_3$. A latch 62 is operably connected to the gate of MOSFET $Q_3$ through line 64 and to the input of the second gate drive 46 through line 66. In like manner, the latch is connected to the drain of transistor $Q_3$ through line 68 and to the $-200$ VDC supply via line 70. The gate of transistor $Q_3$ is connected to the source of MOSFET $Q_4$. The gate of transistor $Q_4$ is connected to capacitor $C_5$ and to a parallel arrangement of diode $D_5$ and resistor $R_6$ which, in turn, is connected to capacitor $C_6$.

The elements constituting the $-200$ VDC and $-100$ VDC power supply 28 generally comprise a transformer $T_1$ with the primary of the transformer being connected to a conventional AC source and the secondary of the transformer being connected to a rectifier bridge 70. A capacitor $C_1$ is arranged in parallel with the output of the bridge. One end of the capacitor provides the $-200$ VDC output after passing through a resistor $R_2$. In like manner, the $-100$ VDC signal is supplied from the same source by way of the divider arrangement provided through resistor $R_1$ and zener diode $Z_{14}$.

Figure 3:
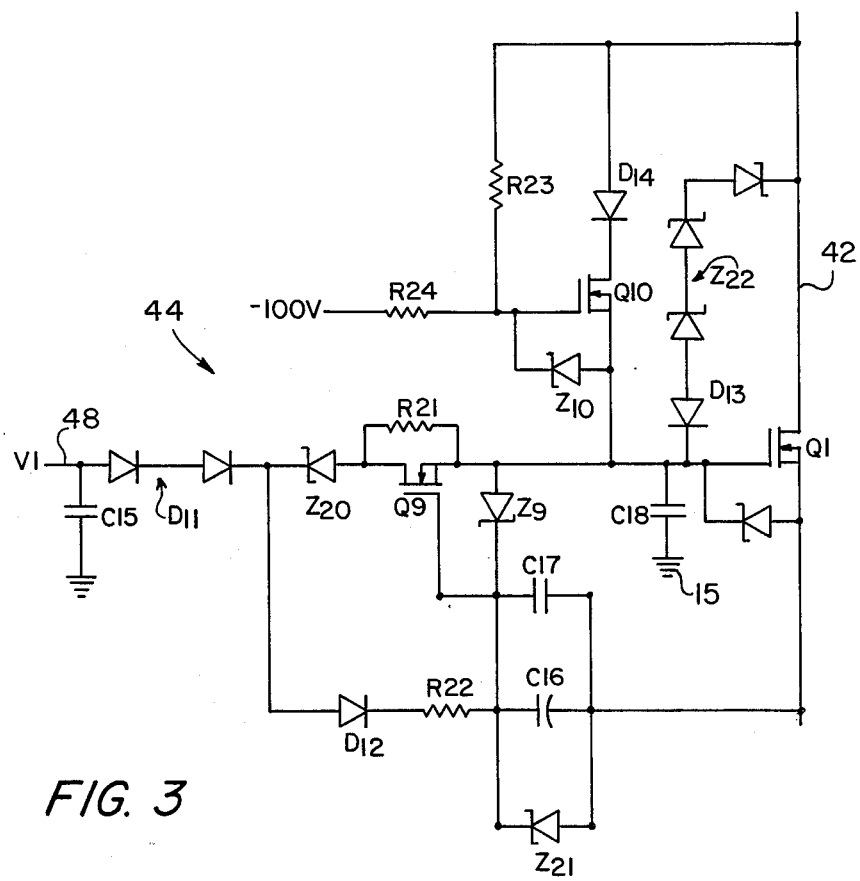
FIG. 3 is a schematic diagram of a preferred embodiment of the first gate drive shown in FIG. 2.

FIG. 3 shows a preferred embodiment of the first gate drive 44. Gate drive 44 generally consists of a series arrangement of zener diodes $Z_{22}$ connected in opposition with diode $D_{13}$ between the drain and gate of transistor assembly $Q_1$. Also connected between the gate and drain of transistor assembly $Q_1$ is MOSFET $Q_{10}$. The gate of transistor $Q_{10}$ is connected to the $-100$ VDC supply 28 via resistor $R_{24}$, to the drain of transistor assembly $Q_1$ through resistor $R_{23}$ and to the source of transistor $Q_{10}$ through zener diode $Z_{10}$. The drain of transistor $Q_{10}$ is connected to the drain of transistor $Q_1$ through diode $D_{14}$.

The gate of transistor $Q_1$ is connected to one side of capacitor $C_{18}$, zener diode $Z_9$ and the source of MOSFET $Q_9$. The voltage signal $V_1$ appearing on line 48 passes through a pair of diodes $D_{11}$ through zener diode $Z_{20}$ and then into the drain of transistor $Q_9$. In turn, the drain and source of transistor $Q_9$ are connected through resistor $R_{21}$. The signal on line 48 also passes through capacitor $C_{15}$.

The gate of transistor $Q_9$ is connected to the source of transistor assembly $Q_1$ through a parallel arrangement of capacitors $C_{17}$ and $C_{16}$ and zener diode $Z_{21}$. In the same fashion, the gate of transistor $Q_9$ is connected to zener diode $Z_9$ and is also connected to zener diode $Z_{20}$ through series-connected diode $D_{12}$ and resistor $R_{22}$.

Figure 4:
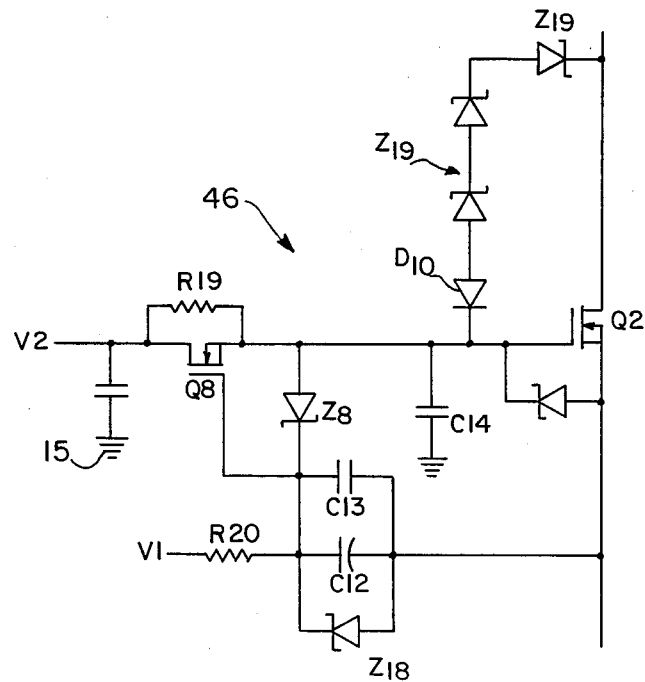
FIG. 4 is a schematic diagram of a preferred embodiment of the second gate drive of FIG. 2.

FIG. 4 shows a preferred embodiment of the second gate drive 46 and also includes a zener diode arrangement $Z_{19}$ and diode $D_{10}$ which generally corresponds to diode arrangement $D_{13}$ and $Z_{22}$ that is provided in connection with transistor assembly $Q_1$. Capacitor $C_{14}$ is associated with the gate of transistor assembly $Q_2$ in much the same way as capacitor $C_{18}$ is associated with the gate of transistor assembly $Q_1$. Further, the gate of transistor assembly $Q_2$ receives the voltage signal $V_2$ on line 52 after passing from the drain to the source of transistor assembly $Q_8$. The gate of transistor $Q_8$ is connected to the source of transistor $Q_2$ through the parallel arrangement of capacitors $c_{12}$ and $c_{13}$ *and zener diode* $Z_{18}$. The gate also receives voltage signal $V_1$ after it passes through resistor $R_{20}$. Finally, the gate and the source of transistor $Q_8$ are coupled to each other through zener diode $Z_8$. In like manner, the drain and source of transistor $Q_8$ are connected to each other through resistor $R_{19}$. Line 52 is also connected to the capacitor $c_{11}$.

Figure 5:
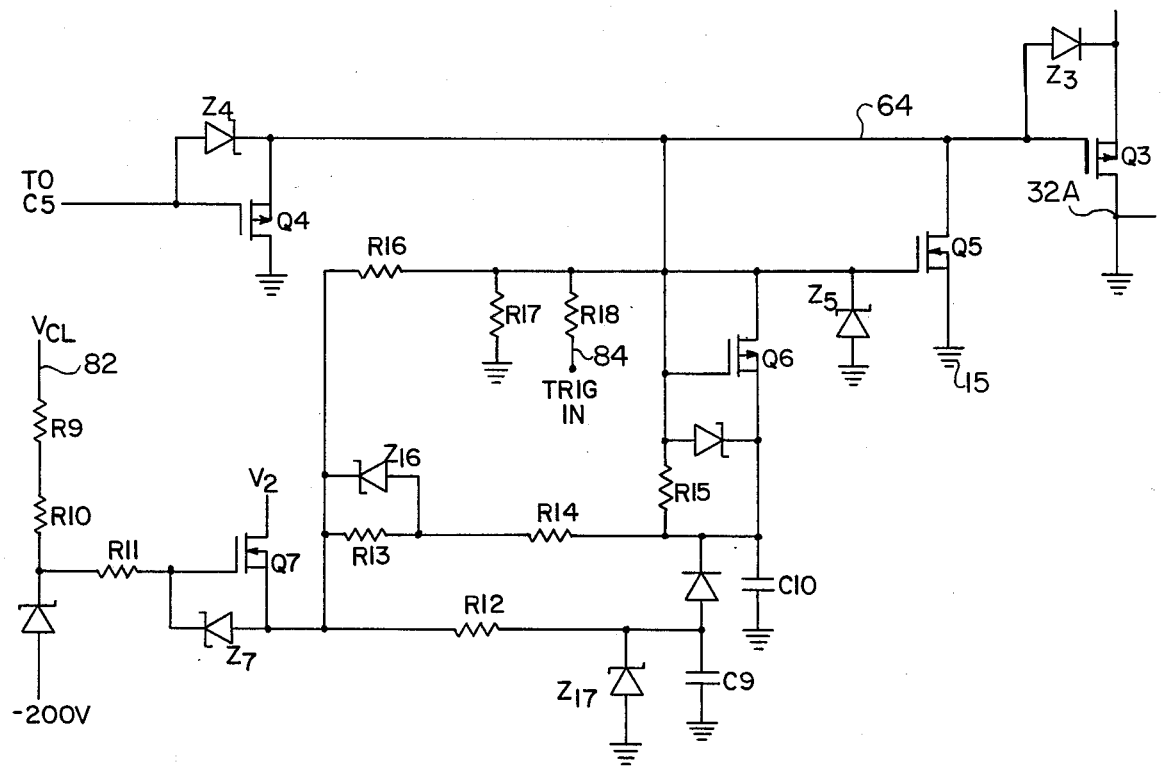
FIG. 5 is a schematic diagram of a preferred embodiment of the latch shown in FIG. 2.

FIG. 5 is a schematic diagram of a preferred embodiment of the latch 62 generally shown in FIG. 2.

In the latch, the gate of transistor $Q_3$ is connected to the drain of MOSFET and source of MOSFET $Q_4$. The gate of transistor $Q_3$ is also connected to the gate of transistor $Q_4$ through zener diode $Z_4$. Likewise, the gate of a MOSFET $Q_6$ is connected to the gate of transistor $Q_3$, with the drain of transistor $Q_6$ being connected to the gate of transistor $Q_5$ and to diode $Z_5$. An input trigger signal is passed to the gate of transistor $Q_5$ through resistor $R_{18}$ and to the second common connection through resistor $R_{17}$.

MOSFET $Q_7$ has its source connected to the drain of transistor $Q_6$ through resistor $R_{16}$ and to the source of transistor $Q_6$ through the arrangement of resistors $R_{12}$ through $R_{14}$, the zener diodes $Z_{16}$ and $Z_{17}$ and the capacitors $C_9$ and $C_{10}$ and diode $D_9$. The signal appearing on line 82 passes through resistors $R_9$, $R_{10}$ and $R_{11}$ to the gate of transistor $Q_7$. In like manner, the $-200$ V signal on line 70 passes through diode zener $Z_{15}$ and resistor $R_{11}$ to the gate of transistor $Q_7$. The source and gate of transistor $Q_7$ are connected through diode $Z_7$.

Figure 6:
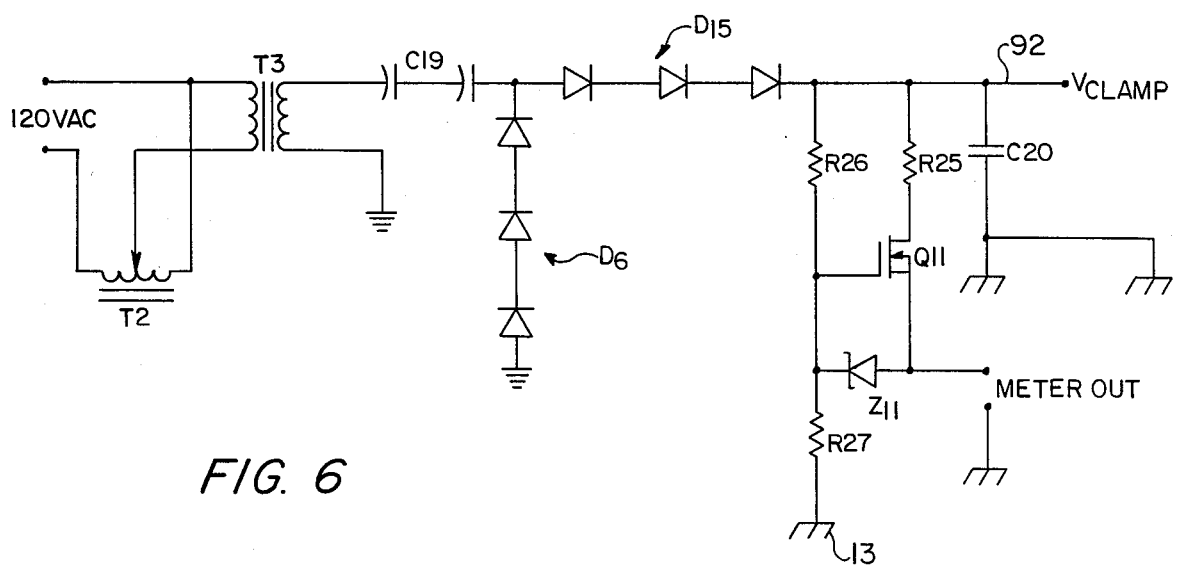
FIG. 6 is a schematic diagram of a preferred embodiment of the voltage clamp power supply shown in FIG. 2.

FIG. 6 shows a preferred embodiment of the voltage clamp power supply 40 and basically comprises a variable transformer $T_2$ connected to the primary winding of a second transformer $T_3$. The secondary winding of the transformer is connected to a voltage multiplier made up of a series of diodes $D_{15}$ and $D_{16}$ after passing through two capacitors $C_{19}$ *in series. In a preferred embodiment, each of the diode arrangements* $D_{15}$ and $D_{16}$ consists of three serially connected diodes for the purpose of increasing the inverse voltage capability. The output of the first diode in the arrangement $D_{15}$ provides the V-clamp signal on line 92. The gate and the drain of MOSFET $Q_{11}$ are respectively connected to line 92 by way of resistors $R_{26}$ and $R_{25}$. The gate and source of resistor $Q_{11}$ are connected together through diode $Z_{11}$ which, in turn, is connected to ground through resistor $R_{27}$. Capacitor $C_{20}$ is connected to line 92 and ground.

In use, non-destructive second breakdown tests are performed with a device under test (DUT) connected as shown in FIG. 1, with the base of the DUT connected to the base drive 14, the collector of the DUT connected to the diode assembly $D_3$ and capacitor $C_5$, and the emitter connected to ground. Forward and reverse base drive conditions were preset prior to each test. In a preferred embodiment, all tests are single-shot and manually triggered. However, the testing may be automated through the use of a computer or dedicated logic circuitry for providing the trigger signals.

With reference to FIG. 1, a constant-current forward drive is applied from the base drive 14 to the DUT enabling the collector current to ramp up through inductor $L_1$. A constant-current reverse drive is applied following completion of the forward drive to turn off the DUT. Due to inductance $L_1$, the collector voltage rises to a pre-set clamping supply value or the primary breakdown voltage of the DUT, whichever is lower. Should the DUT enter second breakdown, the collector voltage falls very rapidly, triggering the shunt 24 through capacitor $C_5$. The clamp supply 26 is turned off and the shunt as shown in FIG. 2 causes latch 62 to latch on and crowbar current around the DUT through series-diode $D_1$ and capacitor $C_2$. This sequence of events must occur fast enough, typically less than 50 ns, to save the DUT from destruction.

Prior to the activation of shunt circuit 24, capacitor $C_2$ is charged to $-200$ VDC through resistor $R_3$ to provide an initially large current sink. As current flows through the shunt, capacitor $C_2$ is discharged to the point that diode $D_4$ conducts until capacitors $C_3$, $C_{20}$ and $C_{21}$ are discharged. The collector supply 20 briefly reverts to a current mode operation until the shunt 24 resets automatically for the next test.

With reference to FIG. 2, the operation of the shunt circuit 24 will be described where transistor assemblies $Q_1$ and $Q_2$ are the main MOSFET switches. The DUT is at the bottom left corner of the figure. When second breakdown occurs, a sudden drop of $V_{CE}$ for the DUT turns on transistor $Q_4$ which, in turn, causes transistor assemblies $Q_3$, $Q_2$ and $Q_1$ to be turned on in series with the current of the DUT being diverted through diode arrangement $D_1$, transistor assemblies $Q_1$, $Q_2$ and $Q_3$, and the capacitor $C_2$. Transformer $T_1$ and rectifier 70 provide a $-200$ V power supply that speeds up the diversion of current from the DUT to the shunt when second breakdown occurs.

To reduce the parasitic inductance, the physical layout of the shunt circuit elements should be as close as possible. For example, the 30 MOSFETs which are used to form transistor assemblies $Q_1$ and $Q_2$ are connected both in series and in parallel to achieve 1800 V, 300 A capability (15 n-channel MOSFETs are connected in parallel for both assembly $Q_1$ and assembly $Q_2$). For $Q_3$, 8 p-channel MOSFETs are connected in parallel. Three series-diode assemblies, $D_1$, $D_2$ and $D_3$, are arranged next to each other and are housed in a DO-4 package to minimize parasitic inductance.

Second breakdown in a bipolar junction transistor (BJT) or a gate turn-off thyristor (GTO) is characterized by a rapid drop in the collector voltage usually in less than 5 ns. This high dv/dt is coupled through capacitor $C_5$ to turn on the input stage of transistor $Q_4$. As transistor $Q_4$ turns on, transistor assemblies $Q_3$, $Q_2$ and $Q_1$ are turned on in sequence. The resulting current flows through transistor assemblies $Q_1$, $Q_2$ and $Q_3$, and capacitor $C_2$. The main switches as implemented through transistor assemblies $Q_1$ and $Q_2$ block the voltage when the shunt is not conducting. Low voltage transistor $Q_3$ turns on assembly $Q_2$ by forcing assembly $Q_2$ to ground potential. Transistor assembly $Q_2$, in turn, forces the source of transistor assembly $Q_1$ to approximately ground potential and causes assemblies $Q_1$ and $Q_2$ to be turned on very rapidly without the problem of voltage sharing commonly associated with serial connection of MOSFETs.

When the drain voltage of transistor assembly $Q_2$ collapses by approximately 10 VDC, the gate-to-source voltage of transistor assembly $Q_1$ turns assembly $Q_1$ on. The voltage sharing between transistor assemblies $Q_1$ and $Q_2$ is always in good balance. Resistor $R_6$ and capacitor $C_6$ serve as an input terminating network. Diode $R_5$ shunts any positive charge through capacitor $C_5$ during the turn-off of the DUT which slows transistor $Q_4$ at turn on. As with all MOSFETs, transistor $Q_4$ is protected, gate-to-source, with a transient suppressor, zener diode $Z_4$. Resistor $R_7$ causes transistor $Q_4$ to reduce the turn-on time in case it is required to turn on. Should the collector voltage of the DUT rise to equal the clamp voltage, diode arrangement $D_2$ forward conducts to divert the load current to capacitors $C_3$ and $C_{20}$. If second breakdown occurs, the shunt 24 turns on, diode arrangement $D_1$ forward conducts and the load current is diverted through transistor assemblies $Q_1$, $Q_2$ and $Q_3$ and capacitor $C_2$. The potential of the load of inductor $L_1$ is forced to $-200$ VDC through the shunt 24 to enhance the speed of current diversion. Diode arrangement $D_3$ becomes reverse-biased to prevent reverse current through the DUT.

As explained before, FIGS. 3 and 4 present the details of preferred embodiments for the gate-drive circuits 44 and 46, for transistor assemblies $Q_1$ and $Q_2$, respectively. The input stages of transistors $Q_4$ and $Q_3$ are operated in a conventional fashion by switching the gate voltage, with respect to the source, to turn-on the device. The gate of transistor $Q_4$ is switched by the collector of the DUT and the gate of transistor $Q_3$ is, in turn, switched by transistor $Q_4$. Both transistors $Q_3$ and $Q_4$ are configured as saturable source-followers.

The initial switching of transistor assemblies $Q_2$ and $Q_1$ is inverted, however, to achieve high-speed series operation. The source of each assembly is switched by the preceding stage while the gate is capacitively coupled to the second common connection. Additional gate-drive circuitry provides a DC bias during steady-state operation.

In the second gate drive, capacitor $C_{14}$ is the initial current source as transistor assembly $Q_2$ begins turn-on followed by capacitor $C_{11}$ through transistor $Q_8$. When the gate-source voltage of $Q_2$ reaches 14 V, transistor $Q_8$ turns off and resistor $R_{19}$ acts as a current limiter to zener diode $Z_2$, clamping the gate voltage of transistor assembly $Q_2$ at 15 V. After the shunt resets, transistor $Q_8$ turns on and the gate of transistor assembly $Q_2$ is restored to $V_2$. Zener diode $Z_{19}$ turns transistor assembly $Q_2$ on in the event of a drain-to-source over-voltage.

The first gate drive 44 operates in a similar manner with one basic distinction. The first gate drive along with the transistor assembly $Q_1$ float on the drain voltage of transistor assembly $Q_2$. Transistor $Q_{10}$ provides the DC bias while the high-voltage clamping supply is on. Resistors $R_{23}$ and $R_{24}$ act in concert with transistor $Q_{10}$ as a voltage divider to evenly distribute the clamp supply voltage between transistor assemblies $Q_1$ and $Q_2$. At this time, until the shunt turns on, diode arrangement $D_{11}$ isolates the gate supply, $V_1$ which floats at 200 VDC above the second common connection to provide an adequate drive to transistor assembly $Q_1$.

As explained before, FIG. 5 shows a preferred embodiment for the block LATCH shown in FIG. 2. Transience due to the fall of the collector voltage of the DUT appears at the shunt input through capacitor $C_5$ and turns transistor $Q_4$ on and off. When turned on by transistor $Q_4$, the latch holds the shunt on, diverting the collector current until the clamp supply is safely discharged. Transistors $Q_6$ and $Q_5$ are cross-coupled, gate-to-drain, to form the latch. Transistor $Q_5$ parallels transistor $Q_4$ to hold transistor $Q_3$ on until resetting. To hold the latch on, a bias current flows through transistor $Q_7$. When clamping supply $V_{OL}$ drops below 50 VDC with the shunt on, transistor $Q_7$ cuts off resetting the latch and turning off the shunt.

FIG. 6 shows the circuit diagram for a preferred embodiment of the clamped high-voltage power supply. The variable transformer $T_2$ is used to vary the supply through the step-up transformer $T_3$ and multiplier network formed from capacitor $C_{19}$ and diode arrangements $D_{15}$ and $D_{16}$. Capacitor $C_{20}$ filters the output and provides the energy sink for the clamp. Resistors $R_{26}$ and $R_{27}$ divide the supply output voltage by two for monitoring by an external meter through a buffer formed by MOSFET $Q_{11}$.

Figure 7:
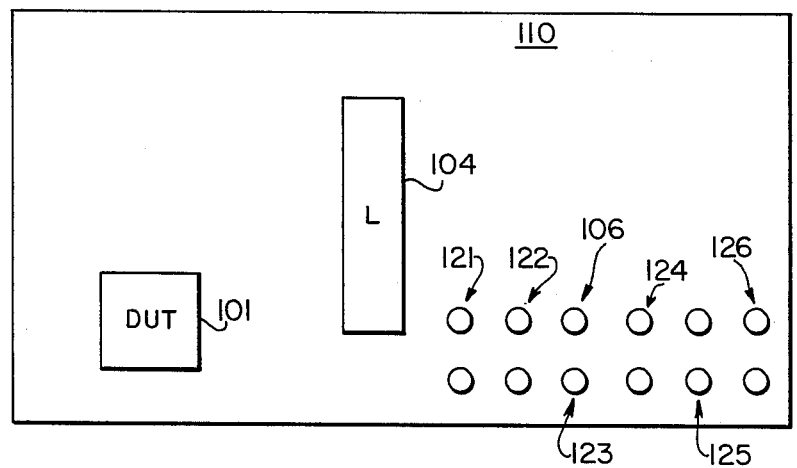
FIG. 7 is a schematic diagram of a control panel for use in practicing the present invention.

FIG. 7 shows in schematic form the control panel 110 for the inventive tester. The DUT socket or holder is located at the lower left of the panel. Inductor 104 is used as the load for the testing circuit. The series of small knobs 106 at the front of the panel are for adjusting the base drive conditions for the DUT. Starting from the left, the first two knobs 121 are the width control for the forward base current and the next two knobs 122 are the amplitude control for the forward base current. The fifth and sixth knobs 123 are the width control for the reverse base current. The seventh and eighth knobs 124 are for setting the base-emitter clamping voltage. The ninth and tenth knobs 125 are the amplitude control for the reverse base current for the first base drive and the last two knobs 126 are the same amplitude control for the second base drive.

Special care should be taken in making the layout of the base drive circuit to reduce the lead length and inductances of the base circuit loop.

Both transistors and GTOs were used as DUTs to demonstrate the capability of the tester.

The tester can be operated in a one-shot measurement mode. In the one-shot measurement, a manual trigger button is used. The test will execute twenty seconds after the manual trigger button is pressed. A high-speed storage scope is used to capture the one-shot measurement waveform. The results of test examples will be explained as follows.

A Westinghouse transistor (KS621K30-2), (rated 1200 V, 300 A) was tested up to 300 A.

Figure 8A:
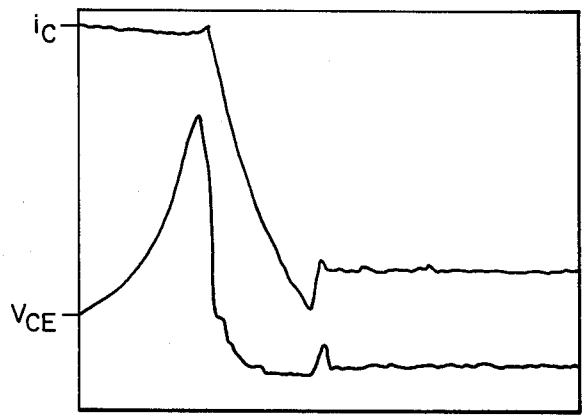
FIGS. 8(A) and 8(B) are waveforms used to explain the operation of the inventive tester.
Figure 8B:
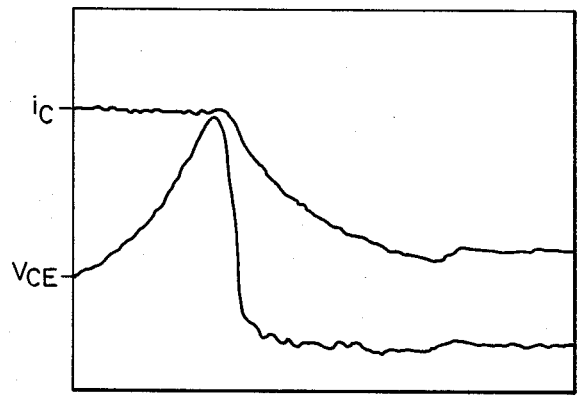

FIGS 8(A) and 8(B) show the waveforms of collector current and collector voltage in a transistor second breakdown test under different circuit conditions with the current ($I_c$) scale being 100 A per division, the collector emitter voltage ($V_{CE}$) scale being 200 V per division and the time being 100 ns per division. In FIG. 8(A), the collector peak current ($I_{CP}$) of a DUT is 300 A. The forward base current ($I_{BF}$) of the device under test is 4 A with the reverse base current ($I_{DR}$) being 16 A. The inductance is 20 microhenrys and the V clamp voltage is 1200 VDC. For the device in FIG. 8(B), the ICP is 200 A, the IBF is 8 A and the IDR is 16 A. The inductance is 20 microhenrys and the V clamp voltage is 1200 VDC.

In the figure, as soon as the DUT is turned off, $V_{CE}$ for the DUT rises until second breakdown occurs. When breakdown occurs, $V_{CE}$ drops very rapidly which triggers the shunt circuit in the current diverter and removes the collector current from the DUT. This sequence of events is completed within a very short period of time and the DUT is saved from destruction. In FIG. 8(A), second breakdown occurred at approximately 1000 V. FIG. 8(B) shows the waveforms for a 300 A test in which second breakdown occurred at 920 V.

Figure 9:
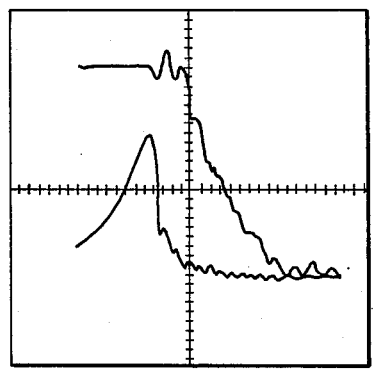
FIG. 9 is a waveform showing test results on the NASA/DOE prior art testing device.

FIG. 9 shows similar test waveforms obtained in the old vacuum tube RBSOA tester constructed under NASA Contract NAG-99 completed in Feb. 1985. In this test, the peak collector current was 95 A compared to 200 A in FIG. 8(A). There is a very significant improvement in the new tester with respect to tester response time as explained in the following. Referring to FIG. 9, it is noted that there are significant delays between the $V_{CE}$ waveform and the $i_c$ waveform. From the waveform, $i_c$ starts to decline 60 ns after the occurrence of second breakdown. Of the 60 ns delay, 30 ns is due to the inherent delay of the current probe. There is still 30 ns, a very significant delay during which high power dissipation occurs in a localized area of the transistor chip. After the delay, approximately 210 ns elapsed before the collector current (95 A) was completely diverted into the shunt. Compared to the waveforms obtained in the new tester, only 130 ns were needed to divert a 200 A current. The declining rate of device current of the new tester is approximately three times faster than that of the old tester. This is because of the much smaller, parasitic, loop inductance achieved in a smaller-size MOSFET shunt circuit. More importantly, the delay time is nearly unnoticed in the waveform in the new tester. As a result of the fast turn-on and the small parasitic inductance of the shunt circuit, the new tester is capable of non-destructive RBSOA testing up to 300 A, 1800 V.

Two GTO types were tested. They were Hitachi's GFF 90 B (rated 600 V, 90 A) and International Rectifier 160 PFT 120 (rated 1200 V, 160 A). FIGS. 10 (A) and 10(B) show the waveforms.

Figure 10A:
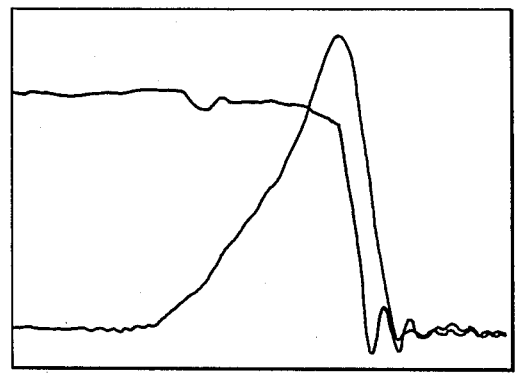
FIGS. 10(A) and 10(B) are waveforms used to explain the operation of the inventive tester.
Figure 10B:
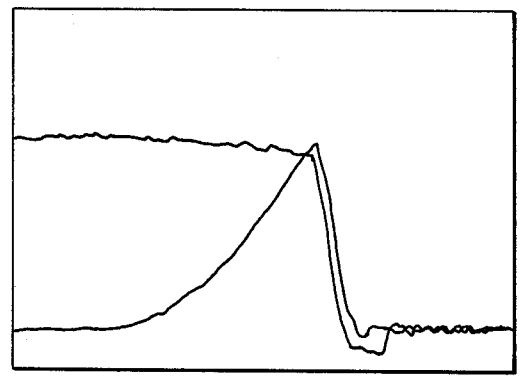

In FIGS. 10(A) and 10(B), the time scale is 100 ns per division. In FIG. 10 (A), when testing the Hitachi GTO, the current scale is 10 A per division and the voltage scale is 100 V per division. The anode current ($I_A$) of the DUT is 50 A peak. The forward gate current ($I_{GF}$) of the DUT is·1 A and the reverse gate current ($I_{GR}$) of the DUT is 30 A. In FIG. 10 (B), when testing the International Rectifier GTO, the current scale is 40 A per division and the voltage scale is 200 V per division. The conditions were changed so that the anode current $I_A$ is 160 A peak, the $I_{GF}$ is 2 A and the $I_{GR}$ is 120 A.

From these tests it is clear that GTO second breakdown phenomenon is very similar to second breakdown in a bi-polar transistor.

From the above, it is apparent that many modifications and variations of the present invention are possible in light of the above teachings. It is therefore to be understood that, within the scope of the appended claims, the invention may be practiced otherwise than as specifically described.

What is claimed is:

1. A non-destructive tester for testing semiconductor devices that have a base-collector-emitter configuration, said tester comprising:
   holding means for holding the device under test;
   base drive means for providing a drive current to the base of the device under test;
   collector supply means for providing a collector current to the device under test;
   current diverting means for diverting current away from said device under test when said device under test experiences reverse-bias second breakdown, said diverting means comprising:
   first, second and third switch means arranged in series;
   diode diverting means connected to said current supply means and said third switch means;
   detecting means for producing a first signal at the onset of reverse-bias second breakdown in the device under test; and
   means for activating said first, second and third switch means in seriatim in response to said first signal, the activation of all of said first, second and third switch means for causing the current applied to said device under test to be diverted through said diode diverting means and said first, second and third switch means.

2. The tester of claim 1, wherein said second and third switch means each comprise a plurality of MOSFETs arranged in parallel.

3. The tester of claim 2, wherein said plurality of MOSFETs is 15.

4. The tester of claim 2, wherein said first switch means is a first MOSFET.

5. The tester of claim 4, wherein said first switch means is turned on in response to said first signal being applied to the base of said first MOSFET; said second switch means is activated by the activation of said first switch means causing the MOSFETS constituting said second switch means to attain ground potential, and said third switch means is activated by the activation of said second switch means causing the MOSFETs constituting said third switch means to attain ground potential.

6. The tester of claim 1, wherein said current supply means comprises an adjustable voltage supply the output of which passes through an inductive load and through a capacitor, said capacitor acting as a current source in response to being charged by said voltage supply.

7. The tester of claim 1, wherein said detector means comprises capacitor means connected to the collector of the device under test, and fourth switch means, said capacitor means responding to a rapid drop in collector voltage taking place when said device under test experiences to onset of reverse-bias second breakdown for activating said fourth switch means, the activating of said fourth switch means producing said first signal.

8. A current diverting circuit for use in non-destructive testing of semiconductor devices that have a base-collector-emitter configuration and receive base and collector currents during testing, said current diverting circuit comprising:
   first, second and third switch means arranged in series;
   diode diverting means connected to said collector of the device under test and to said third switch means;

detecting means for producing a first signal at the onset of reverse-bias second breakdown in the device under test; and means for activating said first, second and third switch means in seriatim in response to said first signal, the activation of all of said first, second and third switch means for causing the current applied to said device under test to be diverted through said diode diverting means and said first, second and third switch means.

9. The current diverting circuit of claim 8, wherein said second and third switch means each comprise a plurality of MOSFETs arranged in parallel.

10. The current diverting circuit of claim 9, wherein said plurality of MOSFETs is 15.

11. The current diverting circuit of claim 9, wherein said first switch means is a first MOSFET.

12. The current diverting circuit of claim 11, wherein said first switch means is turned on in response to said first signal being applied to the base of said first MOSFET; said second switch means is activated by the activation of said first switch means causing the MOSFETs constituting said second switch means to attain ground potential, and said third switch means is activated by the activation of said second switch means causing the MOSFETs constituting said third switch means to attain ground potential.

13. The current diverting circuit of claim 8, wherein said current supply means comprises adjustable voltage supply the output of which passes through an inductive load and through a capacitor, said capacitor acting as a current source in response to being charged by said voltage supply.

14. The current diverting circuit of claim 8, wherein said detector means comprises capacitor means connected to the collector of the device under test, and fourth switch means, said capacitor means responding to a rapid drop in collector voltage taking place when said device under test experiences to onset of reverse-bias second breakdown for activating said fourth switch means, the activating of said fourth switch means producing said first signal.

* * * * *